(12) United States Patent
Palmer et al.

(10) Patent No.: US 9,501,404 B2
(45) Date of Patent: *Nov. 22, 2016

(54) BACK-UP AND RESTORATION OF DATA BETWEEN VOLATILE AND FLASH MEMORY

(71) Applicant: International Business Machines Corporation, Armonk, NY (US)

(72) Inventors: Michael J. Palmer, Southampton (GB); Peter M. Smith, Winchester (GB); Kelvin Wong, Eastleigh (GB)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/439,673

(22) PCT Filed: Jul. 29, 2013

(86) PCT No.: PCT/EP2013/065898
§ 371 (c)(1),
(2) Date: Apr. 30, 2015

(87) PCT Pub. No.: WO2014/075823
PCT Pub. Date: May 22, 2014

(65) Prior Publication Data
US 2015/0317210 A1    Nov. 5, 2015

(30) Foreign Application Priority Data
Nov. 14, 2012    (GB) .................................. 1220442.6

(51) Int. Cl.
*G06F 11/00* (2006.01)
*G06F 12/02* (2006.01)
*G06F 11/14* (2006.01)

(52) U.S. Cl.
CPC ....... *G06F 12/0246* (2013.01); *G06F 11/1441* (2013.01); *G06F 2212/1032* (2013.01);
(Continued)

(58) Field of Classification Search
CPC ................ G06F 11/1076; G06F 11/108; G06F 12/0246; G06F 2212/7204; G06F 2212/7207; G06F 2212/7208
See application file for complete search history.

(56) References Cited

U.S. PATENT DOCUMENTS 5,802,551 A    9/1998 Komatsu et al.
7,856,528 B1    12/2010 Frost et al.
(Continued)

FOREIGN PATENT DOCUMENTS

EP    2249243 A1    11/2010
EP    2299363 A1    3/2011
(Continued)

OTHER PUBLICATIONS

Boukhobza et al., "A Cache Management Strategy to Replace Wear Leveling Techniques for Embedded Flash Memory", International Symposium on Performance Evaluation of Computer & Telecommunication Systems (SPECTS) 2011, Jun. 27-30, 2011, The Hague, pp. 1-8, <http://ieeexplore.ieee.org/xpl/articleDetails.jsp? tp=&arnumber=5984840&contentType=Conference+Publications&searchWithin°/03DWear+Leveling+Technique%26queryText%3DNAND+Flash+Memory+Technology>.
(Continued)

*Primary Examiner* — Joseph Kudirka
(74) *Attorney, Agent, or Firm* — James H. Mayfield

(57) ABSTRACT

In one embodiment, a method for back-up of data to flash memory is provided. Backed up data is organized into one or more stripes, wherein a stripe comprises a set of pages across all available flash memory devices which have a same
(Continued)

block and page address. Responsive to encountering an error in a block of flash memory during back-up of a particular stripe of data, the particular stripe of data is rewritten starting at a next available page address and excluding a page of flash memory for the block having the error. Subsequent stripes of data in the block having the error are written to pages excluding the page of flash memory for the block having the error.

19 Claims, 13 Drawing Sheets

(52) U.S. Cl.
CPC ............. G06F 2212/7202 (2013.01); G06F 2212/7207 (2013.01); G06F 2212/7208 (2013.01)

(56) References Cited

U.S. PATENT DOCUMENTS

| | | | |
|---|---|---|---|
| 8,103,821 B2 | 1/2012 | Chang et al. | |
| 8,112,573 B2 | 2/2012 | Keays | |
| 8,169,839 B2 | 5/2012 | Moshayedi et al. | |
| 8,200,885 B2 | 6/2012 | Sartore | |
| 8,200,929 B1 | 6/2012 | Sartore | |
| 8,566,639 B2 | 10/2013 | Moshayedi et al. | |
| 8,819,337 B1 | 8/2014 | Oshinsky et al. | |
| 9,053,012 B1 | 6/2015 | Northcott et al. | |
| 2006/0015683 A1 | 1/2006 | Ashmore et al. | |
| 2006/0239075 A1 | 10/2006 | Williams et al. | |
| 2008/0256420 A1 | 10/2008 | Hafner et al. | |
| 2009/0172335 A1 | 7/2009 | Kulkarni et al. | |
| 2009/0240873 A1 | 9/2009 | Yu et al. | |
| 2010/0122148 A1 | 5/2010 | Flynn et al. | |
| 2010/0202239 A1 | 8/2010 | Moshayedi et al. | |
| 2010/0318844 A1* | 12/2010 | Matsuda ............. G06F 11/0727 714/6.12 |
| 2011/0093650 A1 | 4/2011 | Kwon et al. | |
| 2011/0302445 A1 | 12/2011 | Byom et al. | |
| 2012/0023365 A1 | 1/2012 | Byom et al. | |
| 2012/0151254 A1* | 6/2012 | Horn ...................... G06F 11/108 714/6.22 |
| 2012/0159289 A1 | 6/2012 | Piccirillo et al. | |
| 2012/0185738 A1 | 7/2012 | Gyllenskog et al. | |
| 2012/0236656 A1 | 9/2012 | Cometti | |
| 2012/0239976 A1 | 9/2012 | Cometti et al. | |
| 2013/0173954 A1* | 7/2013 | Woo ...................... G06F 11/167 714/6.13 |
| 2014/0281174 A1 | 9/2014 | Lee | |

FOREIGN PATENT DOCUMENTS

| | | |
|---|---|---|
| GB | 2507691 A | 5/2014 |
| TW | 201428757 A | 7/2014 |
| WO | 2012100087 A2 | 7/2012 |
| WO | 2014075823 A1 | 5/2014 |
| WO | 2014120140 A1 | 8/2014 |

OTHER PUBLICATIONS

Chang et al., "Efficient Wear Leveling in NAND Flash Memory", Inside Solid State Drives (SSDs), Springer Series in Advanced Microelectronics 37, Chapter 9, pp. 233-257, DOI 10.1007/978-94-007-5146-0 9, © Springer ScienceCBusiness Media Dordrecht 2013.

Yun et al., "Bloom Filter-based Dynamic Wear Leveling for Phase-Change Ram", Design, Automation & Test in Europe Conference & Exhibition, Mar. 12-16, 2012, Dresden, DOI: 10.1109/DATE.2012.6176713, pp. 1-6, <http://ieeexplore.ieee.org/xpl/articleDetails.jsp?tp=&arnumber=6176713&contentType=Conference+Publications&searchWithin%3DWear+Leveling%26queryText%3DNAND+Flash+Memoni+Technology>.

"Back-up and Restoration of Data Between Volatile and Flash Memory", UK Patent Application No. 1220442.6, filed on Nov. 14, 2012, pp. 1-29.

"Patent Act 1977: Search Report under Sectio 17(5)", Intellectual Property Office, Your Reference GB920120132GB1, Application No. GB1220442.6, dated Apr. 16, 2013, Dr. Christopher Batty, Examiner, pp. 1-4.

Patent Cooperation Treaty, PCT, Notification of Transmittal of the International Search Report and the Written Opinion of the International Searching Authority, or the Declaration, Applicant's File Reference GB120132, International application No. PCT/EP2013/065898, Oct. 14, 2013, pp. 1-10.

"TN-29-42: Wear-Leveling Techniques in NAND Flash Devices", Micron®, pp. 1-8, © 2008 Micron Technology, Inc.

Micron, "Wear-Leveling Techniques in NAND Flash Devices the Importance of Wear Leveling", TN-29-42, 2008, p. 1-8, Micron Technology, Inc.

Palmer et al., "Fast Data Back-Up and Restore Between Volatile and Flash Memory", Filed on Aug. 19, 2013, p. 1-52, GB Patent Application No. 1314810.1.

UK Intellectual Property Office, "Examination Report under Section 17(5)", Jan. 27, 2014, International Application No. GB 1314810.1.

Palmer et al., "Fast Data Back-Up and Restore Between Volatile and Flash Memory", U.S. Appl. No. 14/460,512, IBM Docket No. GB920130072US1, tiled on Aug. 15, 2014, 56 pages.

IBM Appendix P, list of patents and patent applications treated as related, Apr. 25, 2016, 2 pages.

Borland, Jes Schultz, "Improving the Performance of Backups", Brent Ozar Unlimited®, © 2015, Jan. 21, 2014, <http://www.brentozarcom/archive/2014/01/improving-the-performance-of-backups/>, pp. 1-7.

Palmer et al., "Back-Up and Restoration of Data Between Volatile and Flash Memory", U.S. Appl. No. 14/822,140, filed Aug. 10, 2015, 51 pages.

IBM, Appendix P, List of IBM Patents or Patent Applications Treated as Related, Apr. 15, 2016, 2 pages.

* cited by examiner

BACK-UP AND RESTORATION OF DATA BETWEEN VOLATILE AND FLASH MEMORY

FIELD OF INVENTION

This invention relates to the field of data back-up and restoration. In particular, the invention relates to back-up and restoration of data between volatile and flash memory.

BACKGROUND OF INVENTION

When a main power fail is detected in a system, a pre-charged standby capacitor acts as a temporary power supply so that a controller device can copy data from volatile memory (for example, DRAM) into flash memory, thereby preserving it. On the resumption of main power, the backed up data can then be read from flash memory and restored back into the volatile memory.

There are several solutions which attempt to deal with, in one way or another, the main failure of flash technology, namely the wearing out of flash blocks after a certain number of erasures and programs. They deal with this failure by using wear-leveling algorithms to determine which blocks have had the least number of erasures/program cycles, thereby determining which blocks most likely can be written successfully. Wearing out of blocks is of particular concern in NAND flash technology, although this may also be of concern in NOR flash technology.

The drawback with these solutions is that despite using wear-leveling algorithms, flash page program errors may still occur during back-up. Once the back-up mechanism has begun, i.e. once the system is dependent upon the standby capacitor for power, and if a page program unexpectedly fails within a block, these solutions must spend valuable time erasing a fresh block to replace this previously unknown corrupt block. Otherwise, there may not be enough good blocks to back up all the desired data. The capacitor can only keep the system alive for a limited time. Block erases take significant time which could have been spent actually backing up the data. In addition, these solutions do not provide for the scenario where one or more (but not all) of the available flash devices fail completely. This is why a more adaptive back-up method is needed.

Therefore, there is a need in the art to address the aforementioned problems.

SUMMARY

According to a first aspect of the present invention there is provided a method for back-up of data to flash memory, comprising: organizing backed up data into stripes, wherein a stripe is a set of pages across all available flash memory devices which have the same block and page address; when an error in a block of flash memory is encountered during back-up of a stripe of data, the method includes: re-writing the stripe of data starting at the next available page address and excluding the page of flash memory for the block having the error; and writing subsequent stripes of data in the block to pages excluding the page of flash memory for the block having the error.

The method may include embedding metadata for a stripe of backed up data including an indication of the location of the new error block. Embedding metadata for a stripe of backed up data may embed the metadata in each page of a stripe and may also include: an identification number of the stripe of data; a stripe length field of the amount of data saved in a stripe; and an indication of known error blocks.

All available flash memory devices may include: multiple channels with one channel per device, multiple dies, and multiple planes; and wherein when an error in a block of flash memory is encountered, the specific channel, die, plane location may be excluded from being written to for the block of data.

The method may include: reading metadata from pages of a stripe of data being backed up; determining locations of known error blocks; and avoiding writing the back-up data to the known error blocks in a stripe by writing the back-up data to a next available page in the stripe.

When an error in a block of flash memory is encountered during back-up of a stripe of data, the method may include: updating the metadata embedded in a re-written stripe and each subsequent stripe to include: an updated stripe size to indicate a capacity taking into account the bad block; the location of the new error block.

The method may include: backing-up more than one stripe of data simultaneously; and wherein re-writing a stripe of data when an error block of flash memory is encountered re-writes more than one stripe of data.

The method may include: writing an end marker stripe to indicate an end of backed up data, wherein the end marker stripe includes an indication of stripe length of zero.

The method may include: pre-erasing sufficient blocks of flash memory for backing-up data.

The method may include: restoring backed up data to target memory, including: reading all pages from a stripe of backed up data to target memory, including reading metadata for a stripe embedded in the pages; and using the embedded metadata to allow for bad blocks.

Using the embedded metadata to allow for bad blocks may include: determining which stripe is expected next from the stripe number of the metadata and if is not the expected stripe and is a stripe that has already been read: read data and metadata of stripe including position of new error block; re-read data of stripe excluding the page for the error block, restoring the data of the stripe to where the data for the stripe number should be in target memory; adjust the expected next stripe number.

Using the embedded metadata to allow for bad blocks may include: determining if any known error blocks are in a stripe from the metadata of a stripe; re-read data of stripe excluding the page for the known error block; read subsequent stripes of data in the block excluding the page for the known error block.

According to a second aspect of the present invention there is provided a controller system for back-up of data to flash memory, comprising: a stripe component for organizing backed up data into stripes, wherein a stripe is a set of pages across all available flash memory devices which have the same block and page address; a grown bad block component for determining when an error in a block of flash memory is encountered during back-up of a stripe of data, and for: re-writing the stripe of data starting at the next available page address and excluding the page of flash memory for the block having the error; and writing subsequent stripes of data in the block to pages excluding the page of flash memory for the block having the error.

The system may include: a metadata component for embedding metadata for a stripe of backed up data, wherein the metadata includes an indication of the location of new error block.

The metadata component for embedding metadata for a stripe of backed up data may embed the metadata in each page of a stripe and wherein the metadata may also include: an identification number of the stripe of data; a stripe length field of the amount of data saved in a stripe; an indication of known error blocks.

All available flash memory devices may include: multiple channels with one channel per device, multiple dies, and multiple planes; and wherein when an error in a block of flash memory is encountered, the specific channel, die, plane location may be excluded from being written to for the block of data.

The system may include a known bad block component for: reading metadata from pages of a stripe of data being backed up; determining locations of known error blocks; and avoiding writing the back-up data to the known error blocks in a stripe by writing the back-up data to a next available page in the stripe.

The grown bad block component may include: a metadata updating component for updating the metadata embedded in a re-written stripe and each subsequent stripe to include: an updated stripe size to indicate a capacity taking into account the bad block; the location of the new error block.

The back-up component may be for: backing-up more than one stripe of data simultaneously; and wherein re-writing a stripe of data when an error block of flash memory is encountered re-writes more than one stripe of data.

The system may include an end marker component for writing an end marker stripe to indicate an end of backed up data, wherein the end marker stripe includes an indication of stripe length of zero.

The system may include a pre-erase component for pre-erasing sufficient blocks of flash memory for backing-up data.

The system may include a restoration component for restoring backed up data to target memory, including: reading all pages from a stripe of backed up data to target memory, including reading metadata for a stripe embedded in the pages; and using the embedded metadata to allow for bad blocks.

The restoration component may include a grown bad block component for: determining which stripe is expected next from the stripe number of the metadata and if is not the expected stripe and is a stripe that has already been read: read data and metadata of stripe including position of new error block; re-read data of stripe excluding the page for the error block, restoring the data of the stripe to where the data for the stripe number should be in target memory; adjust the expected next stripe number.

The restoration component may include a known bad block component for: determining if any known error blocks are in a stripe from the metadata of a stripe; re-read data of stripe excluding the page for the known error block; read subsequent stripes of data in the block excluding the page for the known error block.

According to a third aspect of the present invention there is provided a computer program product for back-up of data to flash memory, the computer program product comprising: a computer readable storage medium readable by a processing circuit and storing instructions for execution by the processing circuit for performing a method according to the first aspect of the present invention.

According to a fourth aspect of the present invention there is provided a computer program stored on a computer readable medium and loadable into the internal memory of a digital computer, comprising software code portions, when said program is run on a computer, for performing the method of the first aspect of the present invention.

According to a fifth aspect of the present invention there is provided a method substantially as described with reference to the figures.

According to a sixth aspect of the present invention there is provided a system substantially as described with reference to the figures.

The described aspects of the invention provide the advantage of identifying and reporting the locations of newly discovered bad blocks. Metadata can be interrogated (once power is restored) to determine the locations of new discovered bad blocks encountered during the back-up operation.

Due to the adaptive nature of the save algorithm used by the described method, the save can still continue even if multiple flash devices (but not all) fail during the restore which is also a significant advantage.

Other known solutions to the problem attempt to erase blocks on-the-fly upon encountering a grown bad block so that they have enough storage to complete the save. There is limited time upon detecting power loss to perform a save before power completely is gone and a significant amount of time is wasted if a solution has to spend it erasing blocks. The described method does not have this issue.

BRIEF DESCRIPTION OF THE DRAWINGS

The subject matter regarded as the invention is particularly pointed out and distinctly claimed in the concluding portion of the specification. The invention, both as to organization and method of operation, together with objects, features, and advantages thereof, may best be understood by reference to the following detailed description when read with the accompanying drawings.

Preferred embodiments of the present invention will now be described, by way of example only, with reference to the following drawings in which.

DETAILED DESCRIPTION

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numbers may be repeated among the figures to indicate corresponding or analogous features.

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

Methods and systems are provided for backing up data from a volatile memory source (e.g. DRAM) to non-volatile flash memory and restoring it back to volatile memory. The described methods and systems may be applied to both NAND and NOR flash memory, in particular where wear-out is of concern.

In an embodiment, the described method saves data to flash memory just prior to a system power loss and allows it to be restored once power returns. The method is adaptive because it can deal with defects within the flash memory that were unknown to exist prior to starting the save. Defects may prevent data being saved to certain blocks due to excessive wear. These previously unknown defective blocks are referred to as "grown bad blocks" and cannot be detected until an attempt to write to them is made. Upon detecting a grown bad block, the method uses features to ensure that the data can still be successfully saved and later restored.

The method uses the concept of organizing backed up data into stripes. A stripe is a set of pages across all available flash devices, dies and planes which have the same block and page address. If the method comes across a grown bad block whilst saving a stripe of data, it will re-write that stripe at the next available page address avoiding the defective block.

The method also embeds metadata along with the backed up data. This metadata consists of bitmaps indicating the locations of previously known bad blocks and newly discovered grown bad blocks. The metadata also consists of a stripe number starting at 0 for the first stripe and incrementing with every stripe, and a length field indicating the amount of data saved. The metadata is written into every page of a stripe. At the end of the saved data image, the method writes an end marker which is a stripe whose length field is zero. The method can then use the metadata to successfully re-construct the data during a restore according to the description given below.

Figure 1:
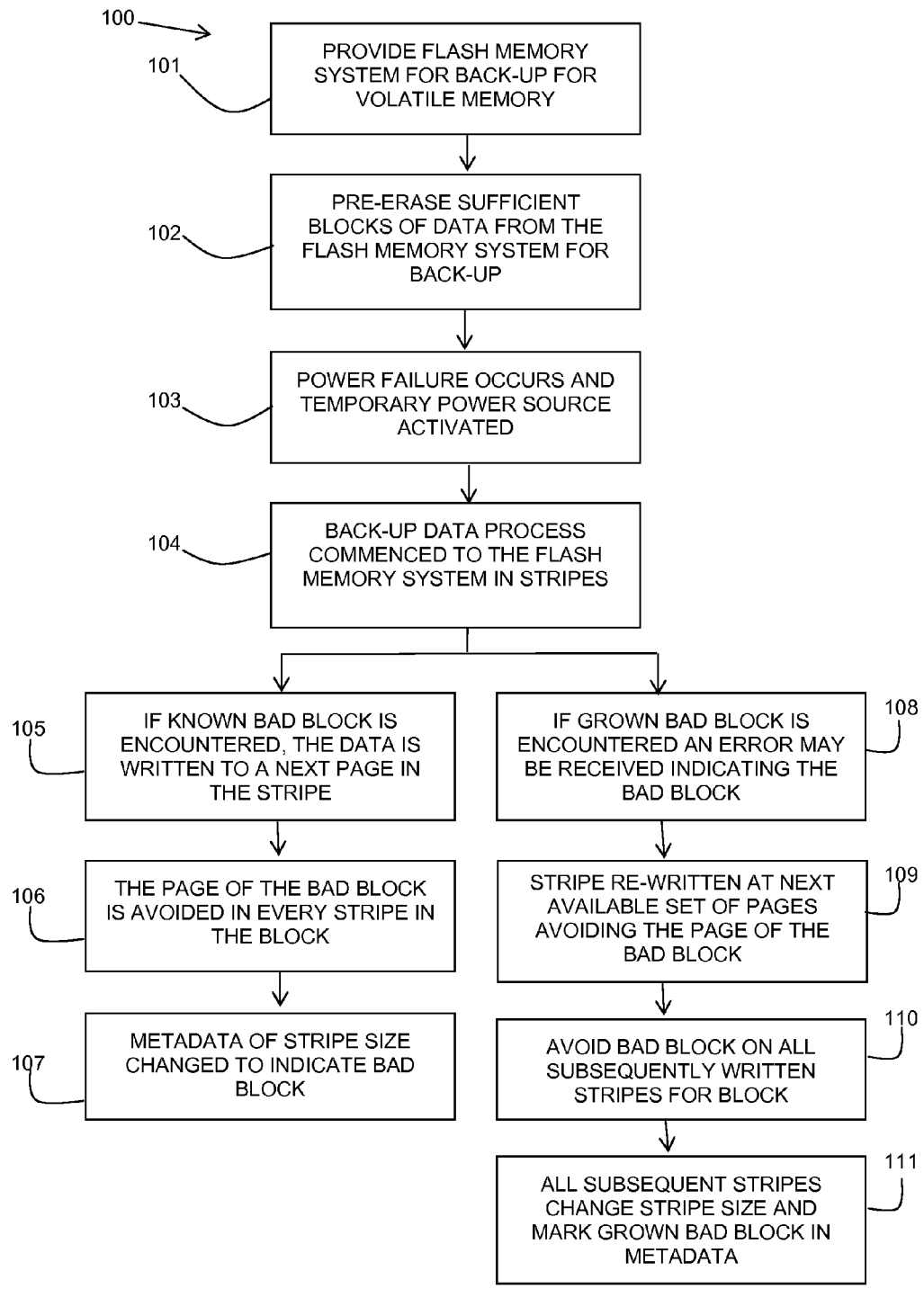
FIG. 1 is a flow diagram of an example embodiment of an aspect of a method, in accordance with the present invention.

Referring to FIG. 1, a flow diagram 100 shows an example embodiment of the aspect of back-up of data of the described method.

A non-volatile memory system, for example, in the form of a NAND or NOR flash memory system is provided (operation 101) for back-up for volatile memory. Sufficient blocks of data may be pre-erased (operation 102) (before the back-up mechanism is enabled) from the flash memory system to hold the amount of data to be backed up. A number of spare blocks may also be pre-erased.

A set of registers hold the starting location of where to write the back-up data to flash memory, the starting location of where to start reading from in source memory, as well as the amount of data to back up. These registers may be initialized before the back-up operation by the user.

A power failure may occur (operation 103) and a temporary power source may be activated, such as a charged capacitor, during which a back-up process may be carried out.

A back-up process may commence (operation 104) by backing up data to blocks of the NAND flash memory system in stripes, as described in detail below.

During the back-up process, two scenarios may be encountered. Firstly, there may be known bad blocks which cannot be written to. Secondly, there may be newly encountered (grown bad) corrupted blocks which cannot be written to of which there is no information prior to the back-up process.

If a known bad block is encountered, the data is written to the next page (operation 105) in the stripe. The page of the bad block may be avoided (operation 106) in every subsequent stripe of the block. Metadata regarding the stripe size is changed (operation 107) to indicate the shorter size due to the bad block.

If a grown bad block is encountered (operation 108) which was not known about previously, an error may be received indicating the bad block. The stripe may be re-written (operation 109) at a next available set of pages avoiding the page of the bad block. The page of the bad block may be avoided (operation 110) for all subsequently written stripes for the block.

The re-written stripe and all subsequent stripes may change (operation 111) the stripe size in their metadata to indicate the bad block, and may also mark the grown bad block in a bitmap in the metadata.

Figure 8:
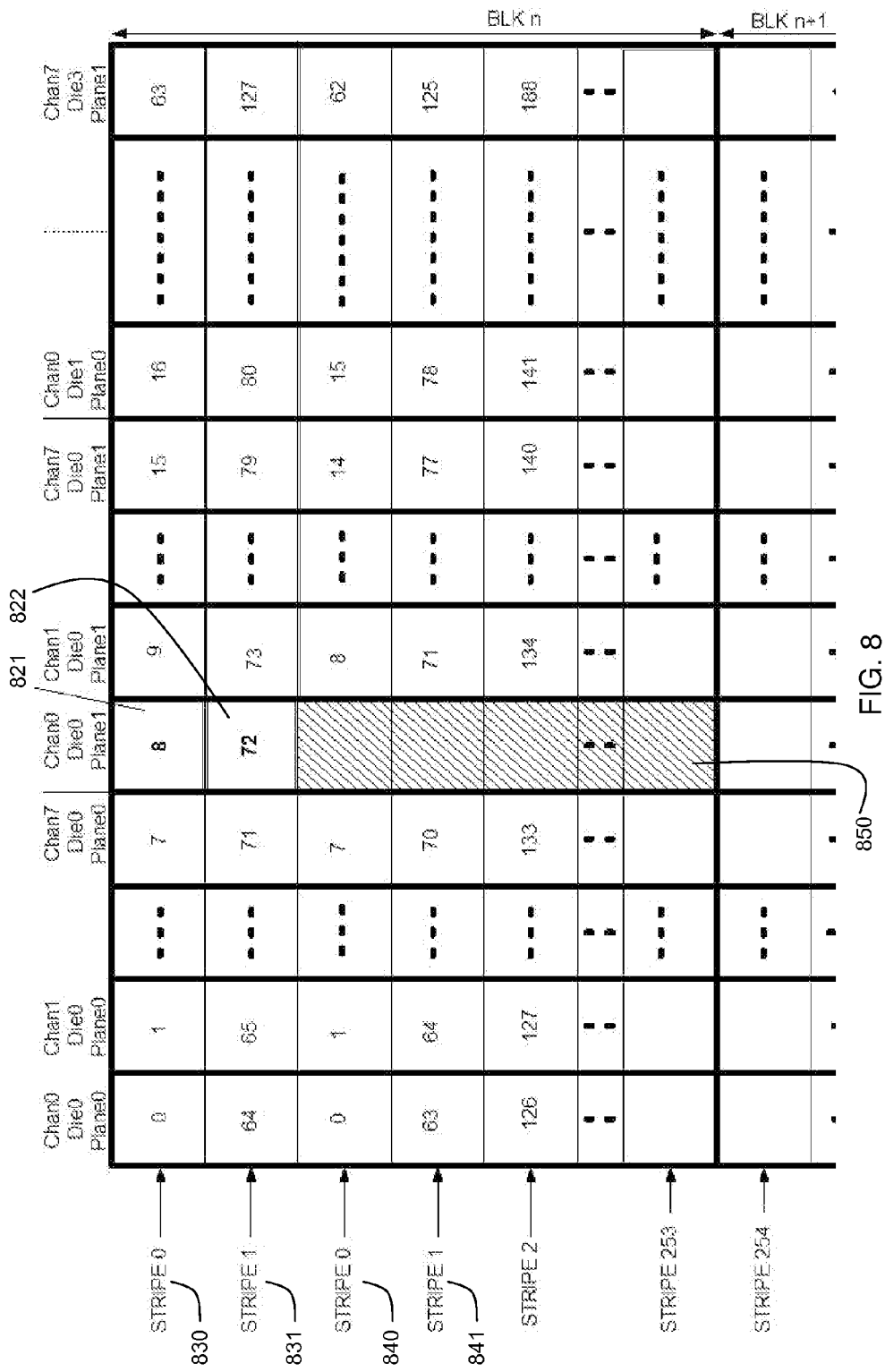
FIG. 8 is a schematic diagram of an example embodiment of a back-up with grown bad blocks, in accordance with an aspect of the present invention.

As discussed further in relation to FIG. 8, more than one stripe may be backed up simultaneously, and the method may be adapted to accommodate this.

As the back-up proceeds, the method embeds metadata about newly encountered corrupt blocks, along with the data to be saved within the flash back-up image. Providing sufficient spare blocks have been pre-erased, the method will continue backing up the data despite encountering unexpected flash page programming errors, and without having to spend "capacitor" time erasing new blocks as a result. The dump will continue even if the failure of a whole flash device is experienced. The method will even tolerate the failure of multiple devices, provided at least one remains usable.

Figure 2:
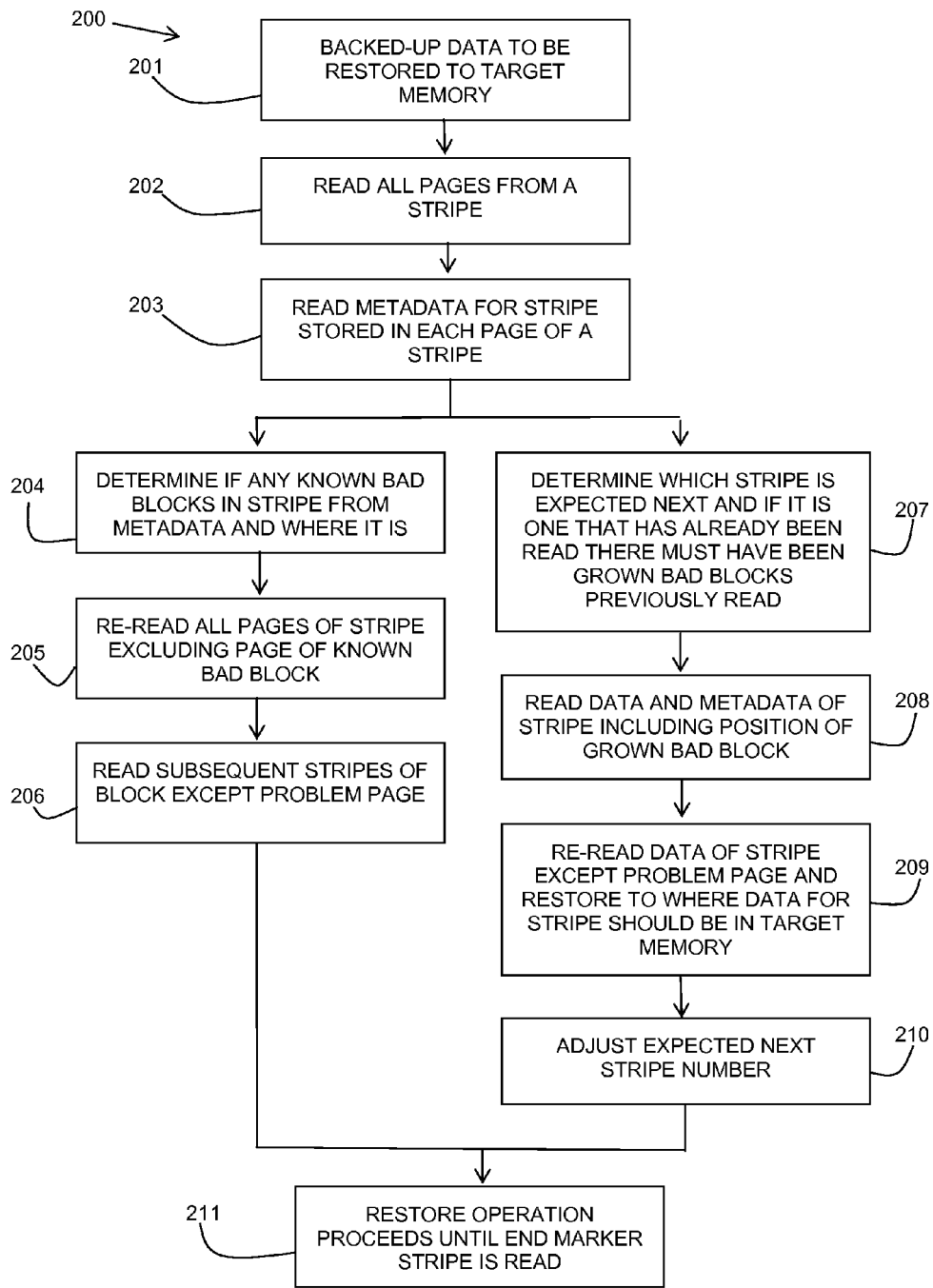
FIG. 2 is a flow diagram of an example embodiment of an aspect of a method, in accordance with the present invention.

Referring to FIG. 2, a flow diagram 200 shows an example embodiment of the aspect of restoration of data of the described method.

When the backed up data is to be restored (operation 201) to a target memory, a read (operation 202) is carried out of the backed up data of a stripe. The metadata for a stripe is read (operation 203) as stored in each page of the stripe.

The metadata is used to determine the locations of any known bad blocks and/or any new corrupted blocks, or whether an entire device failed. From this, the method can determine how to correctly restore the data despite these setbacks. In this way, the method adapts to errors encountered during a back-up.

The two scenarios of restoration of a stripe with known bad blocks and grown bad blocks are further described in FIG. 2.

To accommodate known bad blocks, it may be determined (operation 204) if any known bad blocks are in a stripe from the metadata and, if so, where they are. If there is a known bad block, all the pages of a stripe may be re-read (operation 205) excluding the page of the known bad block. All subsequent stripes in the block may be read (operation 206) while excluding the problem page.

To accommodate grown bad blocks, it may be determined (operation 207) which stripe number is expected next from the metadata and, if the stripe number is one that has already been read, this indicates that there must have been grown bad blocks in the data of the previously read stripe.

The data and the metadata of the stripe are read (operation 208) including the position of a grown bad block. The data of the stripe is then re-read (operation 209) excluding the problem page in the stripe, and the data of the stripe is restored to where the data for the stripe number should be in the target memory. The next expected stripe number is adjusted (operation 210).

In all cases, the restore operation proceeds (operation 211) until an end marker stripe is read.

Figure 3:
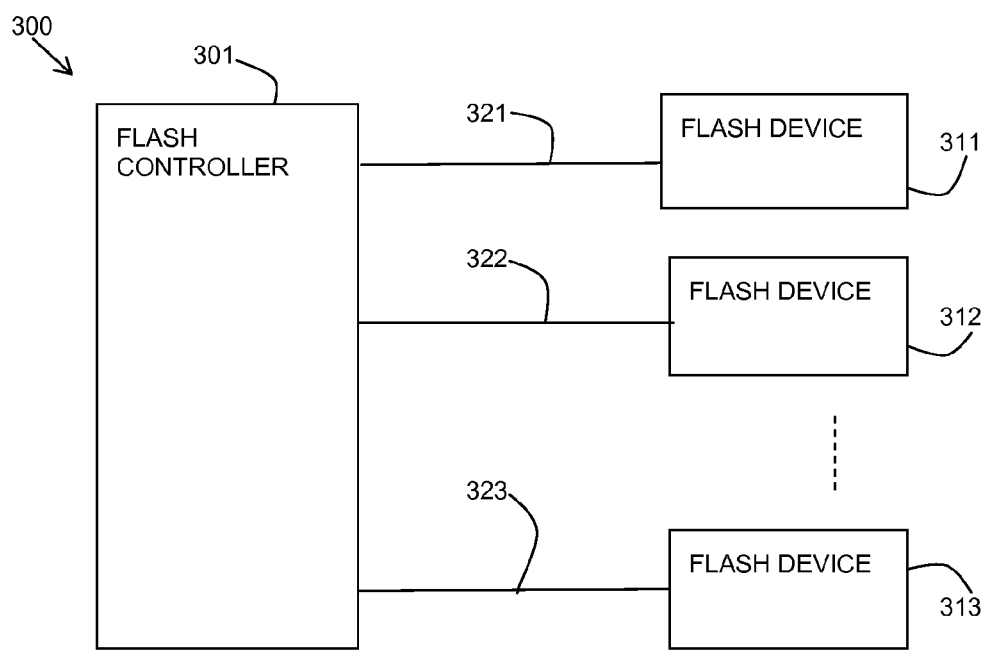
FIG. 3 is block diagram of an example embodiment of a flash memory system, in accordance with the present invention.

Flash devices are divided into dies, and each die has two planes. Each plane consists of a certain number of blocks (usually multiples of 1K), and each block has a certain number of pages (usually multiples of 128). Each page holds a given payload of data. It is also possible to control multiple flash devices simultaneously through separate interfaces as shown in FIG. 3. In this description, each distinct flash device is known as a channel.

Referring to FIG. 3, a flash memory system 300 is shown having a flash controller 301 for controlling multiple flash devices 311-313. Each flash device 311-313 has a flash interface 321-323 with the flash controller 301. In this description, each distinct flash device 311-313 is referred to as a channel.

The described method uses a concept of a "stripe", which consists of all the pages in every available plane and in every available channel that have the same page address and block address.

Figure 4:
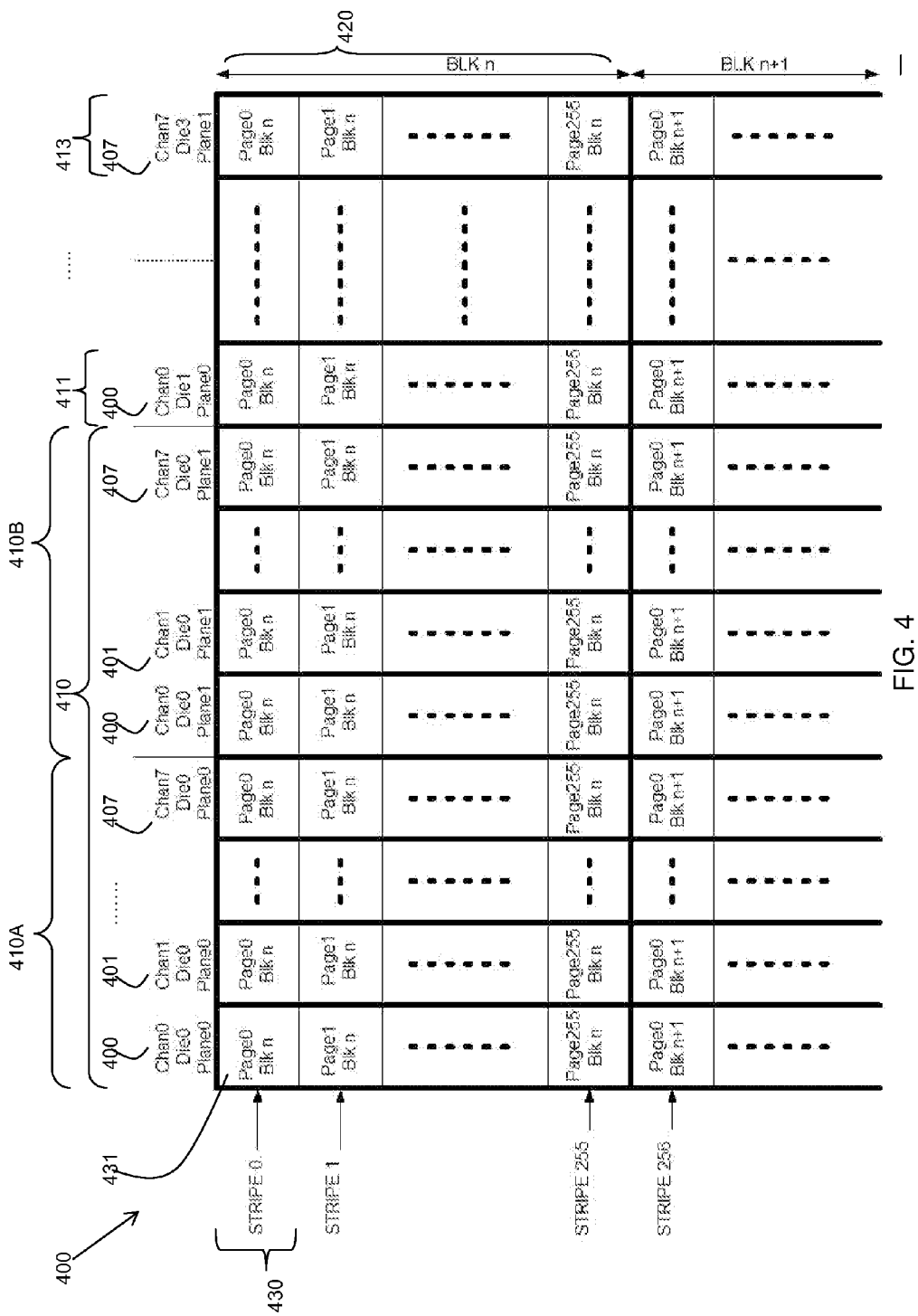
FIG. 4 is a schematic diagram an example embodiment of a flash memory system, in accordance with an aspect of the present invention.

Referring to FIG. 4, a schematic diagram 400 shows an example embodiment of several stripes that reside at various page and block addresses in a flash memory system.

In this example embodiment, there are eight active channels 400-407 (numbered 0 to 7) with each channel containing four dies 410-413 (numbered 0 to 3). Given that there are two planes 410A, 410B per die, a single stripe consists of 64 pages. In addition, each block 420 on a plane consists of 256 pages. Thus, across all channels, dies and planes, there can be 256 stripes 430 (0 to 255) per logical block address (LBA).

Each stripe 430 is a set of pages 431 across all available flash devices which has the same block and page address across all the channels, dies and planes.

Figure 5A:
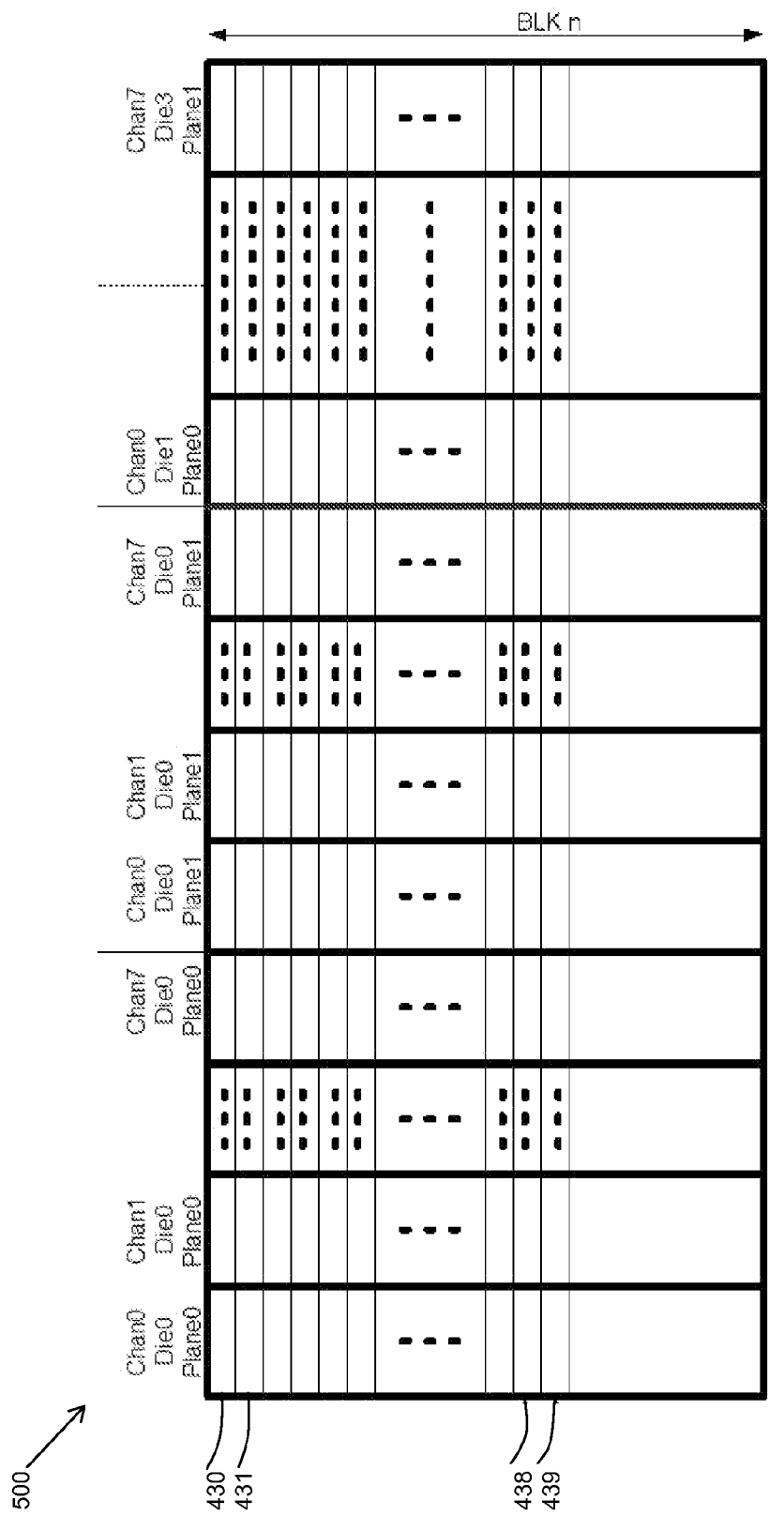
FIGS. 5A and 5B are schematic diagrams of example embodiments showing stripes of data, in accordance with an aspect of the present invention.

Referring to FIG. 5A, a schematic diagram 500 shows a back-up process using the example embodiment of FIG. 4. It is assumed that the data to be backed up to flash memory (the source data) exists in a contiguous memory space within the system.

Back-up begins by copying enough source data to fill 64 flash pages in Stripe 0 430, then doing the same for Stripe 1 431, and so on until all the required data has been backed up. A last Stripe X 438 is shown (for page x, block n).

When this occurs, an end marker stripe 439 (whose format is described later) is written at the next available page address (at page x+1, block n).

When power is restored, the saved data in flash memory can be copied back into a target location in system memory. This data restore begins by reading the flash data from Stripe 0 and writing it to this target location. The data from Stripe 1 is then read and copied to the next part of target space, and so on. The restore operation finishes when the end marker is read.

In order to adapt to errors during the back-up process, and in order to log the locations of flash blocks that have become bad or unusable, the described method writes a set of metadata into each page of each stripe (the remainder of a page may be filled up with source data). The metadata consists of the following:

Stripe number—beginning from 0 and usually increments with each stripe. However, newly discovered bad blocks can cause page program errors. When these are encountered, the method may have to backtrack a little and re-write stripes at a later location. Thus, it is possible for a flash image to contain two or more stripes which have the same Stripe number. (Note that it is not possible to overwrite a piece of flash memory once it has been written without performing a complete erase of a block. A stripe re-write must therefore be done on a "fresh" piece of flash memory).

Stripe Size—this is the amount of backed up data contained within the stripe. The end marker is denoted by this field being zero.

Known Bad Pages Map—this is a bitmap which has one bit to represent every page in the stripe. If a bit is on, it indicates that the corresponding page in the stripe is known (before the back-up operation begins) to belong to a bad block. Manufacturers provide a list for each flash device sold indicating the locations of each block known to be unusable within the device.

Grown Bad Pages Map—this is also a bitmap which has one bit to represent every page in the stripe. If a bit is on, it indicates that a particular page in the stripe belongs to a block that was discovered to be bad some time during the back-up operation. This block was not included in the original bad block list provided by the flash manufacturer.

Figure 5B:
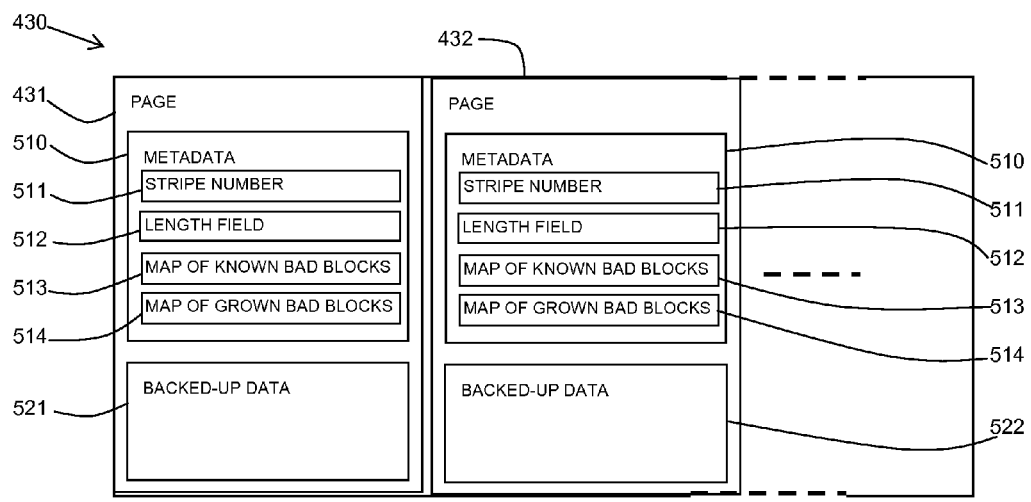

Referring to FIG. 5B, a schematic diagram shows the data stored in each of the pages of a stripe 430 across multiple channels of flash devices, i.e., each page with the same page and block address.

The first two pages 431, 432 are shown in the stripe 430. Each page 431, 432 in a stripe 430 includes a set of metadata 510 including a stripe number 511, a length field 512 for the amount of data saved in a stripe which may be changed if bad blocks are encountered or known about, a bitmap 513 of known bad blocks, and a bitmap 514 of grown bad blocks. The pages 431, 432 also include the backed up data 521, 522 with the backed up data 522 of the second page 432 following on from the backed up data 521 of the first page 431.

The size of the metadata stored in each page is typically very small compared to the available payload of a page. The exact size of the metadata depends on the exact configuration of flash memory used.

Example Metadata

The largest stripe number is the product of the number of blocks and number of pages per block of the device used. In the described embodiment, 4 bytes may be sufficient to store this, which results in an available 4 Giga-stripes. With 64 planes per stripe and 8K pages, that would result in 2 TBytes of data range, as an example.

For the map of known bad blocks and the map of grown bad blocks, one bit is required per plane in a stripe. In the embodiment described, which used 64 planes per stripe, each map would therefore be 8 bytes in size.

For the stripe size field, one could choose the number of pages as a unit measure. Thus, in the embodiment described, 7 bits (to represent decimal number 64) could be used; this could be rounded up to 1 byte. Therefore, in this example, a total of 21 bytes may make up the metadata.

As an example, for an 8K flash page, which is a typical page size and has 8640 bytes of available payload, the metadata would represent less than 0.3% of the available payload. The remainder could be used to store backed up data and error correction codes (ECC).

Figure 6:
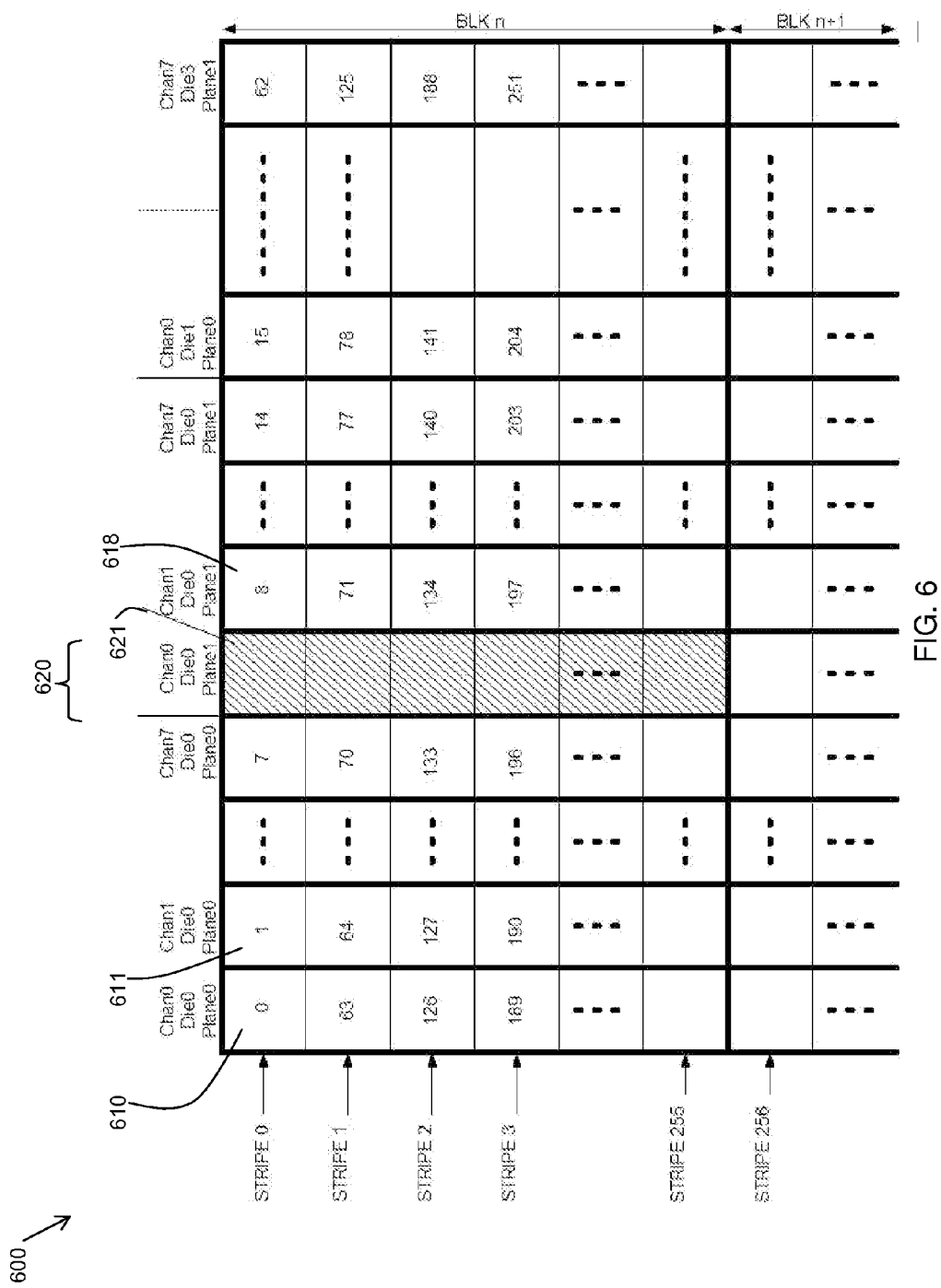
FIG. 6 is a schematic diagram of an example embodiment of a back-up with known bad blocks, in accordance with an aspect of the present invention.

Referring to FIG. 6, a schematic diagram 600 illustrates an example embodiment of how the described method embeds the presence of known bad blocks within a flash image, using the example of FIG. 4.

A page of source data 610, 611, is denoted by the ascending numbers 0, 1, etc. in each box of FIG. 6 (increasing horizontally across each stripe). The vendor's bad block list indicates that block n, of plane 1, on die 0, channel 0 is bad—represented by vertical line 620 of squares across the stripes. The described method uses this information to avoid every page 621 in the block for that particular plane.

In FIG. 6, it can be seen that page 8 of the source data (in Stripe 0) is not written to plane 1, die 0, channel 0. Instead, it is written at the next available page 618 in the stripe (plane 1, die 0, channel 1). A similar thing happens with subsequent stripes within block n. The result is that each stripe holds 63 pages of data rather than the full capacity of 64. The "Stripe Size" metadata field for each stripe will reflect this. The known bad pages map metadata field in every other page in block n will indicate that block n for plane 1, die 0, channel 0 is bad.

When restoring the data shown in FIG. 6 from flash memory, the described method proceeds with no foreknowledge of bad planes. It will attempt to read every single available page in Stripe 0 including the page belonging to the known bad block, and restore the data to a target space on the system. It may get an error when reading the page on the bad block, but it will be able to read the other 63 pages successfully.

Figure 7A:
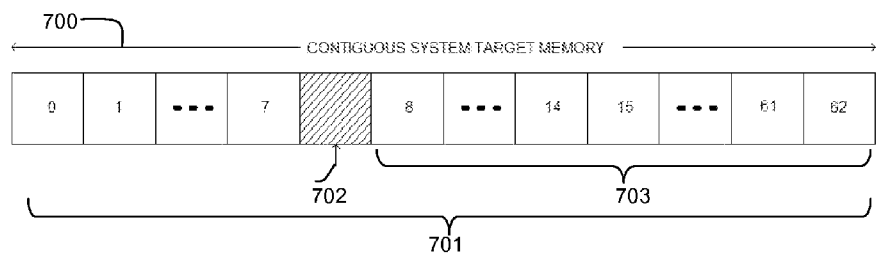
FIGS. 7A to 7C are schematic diagrams of an example embodiment of restoring backed up data with known bad blocks, in accordance with an aspect of the present invention.
Figure 7B:
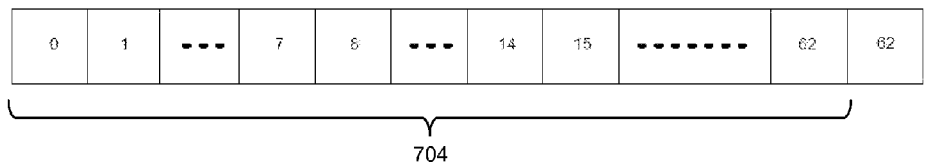
Figure 7C:
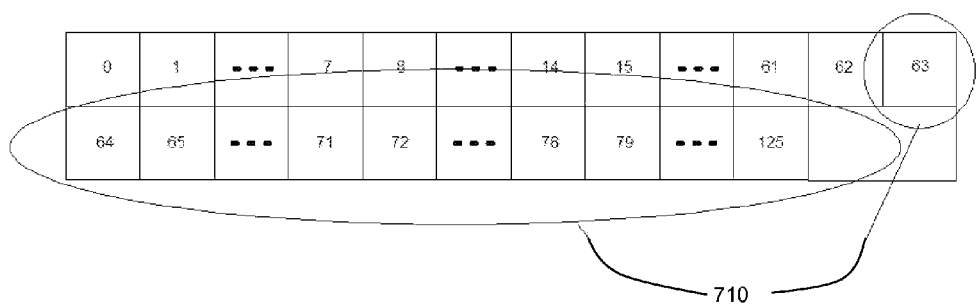

FIGS. 7A to 7C illustrates the example embodiment of FIG. 6 when restoring backed up data when a known bad block is in a flash device.

Referring to FIG. 7A, a diagram shows the Stripe 0 701 as written back to contiguous system target memory 700 including the page 702 to which no data is copied due to failure reading a page from the known bad block at block n, channel 0, die 0, plane 1. It will also, as a consequence, initially write all the pages from page 8 onwards 703 of Stripe 0 to the wrong position in the target space.

Upon reading all the pages in the stripe, the described method then interrogates the known bad plane map metadata field and determines that there was one page belonging to a known bad block. From this, the described method can deduce that the page of plane 1, die 0, channel 1 actually contains page 8 of the back-up data rather than page 9.

Referring to FIG. 7B, all pages of Stripe 0 701 are re-read 704 excluding the page 702 on the known bad block, and the piece of target space is overwritten with the data now in the correct place.

In addition, now that the location of a bad block has been determined, the described method knows to avoid reading any pages from plane 1, die 0, channel 0 for the remainder of block n.

In FIG. 7C, the contents of Stripe 1 710 are copied to target space except for the page from this bad block.

Referring to FIG. 8, a schematic diagram 800 illustrates an example embodiment of how the described method embeds the presence of newly discovered (grown) bad blocks within a flash image, again using the example of FIG. 4.

If the described method encounters an error whilst programming a flash page, it assumes that that page belongs to a grown bad block. The example of FIG. 8 has the same flash configuration as that of FIG. 6; however, unlike the scenario of FIG. 6, it is not known before the back-up operation is initiated that block n on plane 1, die 0, channel 0 is bad—represented by square 821.

In order to efficiently use the time provided by the pre-charged capacitor during a power-down, various embodiments of the described method may attempt to write multiple stripes at a time. In the embodiment discussed in this example, it is efficient for the described method to write two stripes at once. Thus, Stripes 0 830 and 1 831 can be started together. As soon as Stripe 0 830 has completed (and provided it completed with no errors), Stripe 2 can be started; when Stripe 1 831 has completed (with no errors), Stripe 3 can be started, and so on. It is efficient to be writing two stripes at once because a single plane may typically handle two page program commands at once and thus collectively the flash devices are capable of writing two stripes at a time.

Flash page program commands are initiated to write Stripes 0 830 and 1 831. For Stripe 0 830, the described method attempts to write pages 0-63 of the source data. This includes writing page 8 of the source data to page 821 address 0 of block n on plane 1, die 0, channel 0. For Stripe 1 831, the described method attempts to write pages 64-127. This includes writing page 72 of the source data to page 822 address 1 of block n on plane 1, die 0, channel 0. The stripe size metadata fields in both stripes indicate that they each have a capacity of 64 pages.

When writing to pages 0 821 and 1 822 of block n on plane 1, die 0, channel 0, the described method will receive errors. In response, the described method re-writes Stripe 0 830 (with stripe number metadata field set to 0) onto the next set of pages 840 (in this case all pages with page address 2 of block n) and, similarly, re-writes Stripe 1 831 (with stripe number metadata field set to 1) onto the set of pages after that 841.

Now that the described method knows that block n on plane 1, die 0, channel 0 is bad, it avoids writing to any pages on that plane 650 for the remainder of block n. The re-written versions of Stripes 0 and 1, as well as all subsequent stripes in block n, will mark in the grown bad planes map metadata field that there was a bad block discovered at block n on plane 1, die 0, channel 0. The stripe size metadata fields will also indicate a capacity of 63 pages, taking into account the presence of a new grown bad block.

Referring to FIGS. 9A to 9E, the schematic diagrams show an example embodiment of what happens when the described method attempts to restore the data saved in the example of FIG. 8 back to target memory.

Figure 9A:
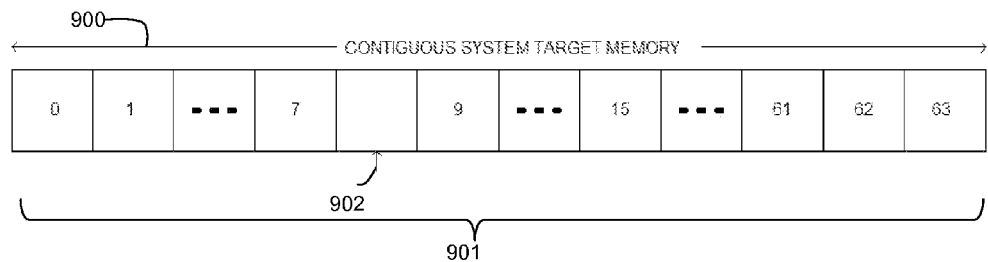
FIGS. 9A to 9E are schematic diagrams of an example embodiment of restoring backed up data with grown bad blocks, in accordance with an aspect of the present invention.

The described method keeps track of which stripe it is expecting to see next, beginning with Stripe 0. The described method will begin by reading all pages in block n with page address 0. It will attempt to restore the data from all 64 pages into the target area, not realizing that a grown bad plane was discovered during the back-up. This is shown in FIG. 9A, which shows a stripe of data 901 written back to system memory 900 including the section 902 to which no data is copied due to failure reading a page from the grown bad block.

Figure 9B:
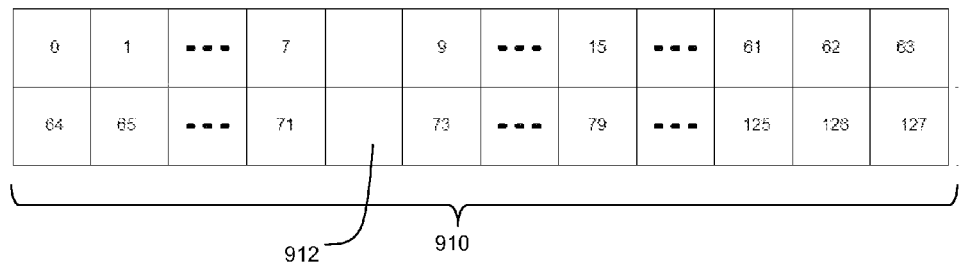

Referring to FIG. 9B, the described method is expecting this stripe 901 to be Stripe 0, and since the stripe number fields of the stripe indicate this is indeed Stripe 0, the described method carries on to reading the stripe at the next page address. The next stripe 910 the described method expects to see is Stripe 1. It reads all pages in block n with page address 1 and writes the data within this stripe 910 to the next part of the target area, again not realizing that a grown bad plane 912 was discovered. The stripe number metadata fields indicate Stripe 1 as expected, and the described method proceeds to the next page address, which is 2.

Figure 9C:
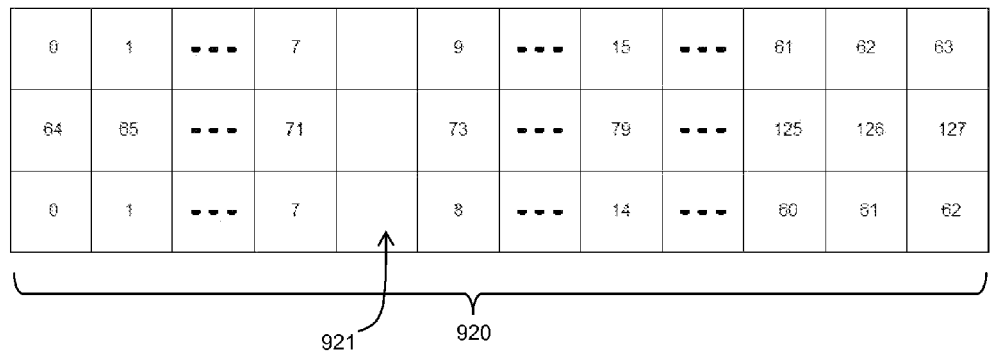

Referring to FIG. 9C, the described method reads the stripe 920 at page address 2 and expects this to be Stripe 2. The described method restores the data it reads to the next part of the target area after the data from Stripes 0 and 1. Once all the pages at page address 2 have been read, the described method can tell from the stripe number field, that this is a re-write of Stripe 0. The described method has also read the grown bad pages map from this stripe and determined that a grown bad plane 921 was discovered previously at plane 1, die 0, channel 0.

Figure 9D:
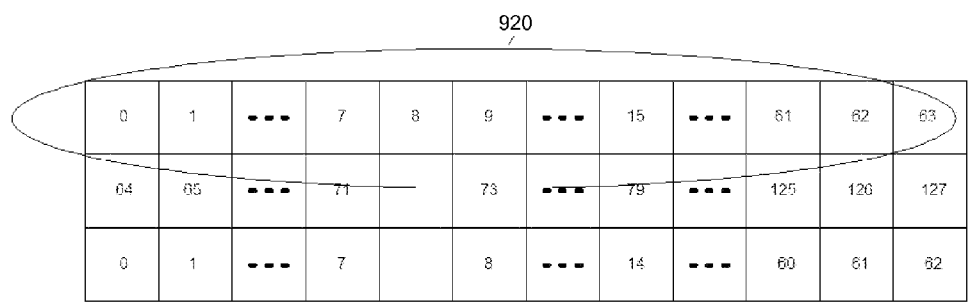

Referring to FIG. 9D, on seeing this, the described method re-reads every page in this stripe 920 with the exception of the page on the grown bad plane 921, and restores it to where the data for Stripe 0 should reside in target memory. The described method adjusts the stripe number it expects to see next to the value of Stripe 1 (having just re-read Stripe 0), and proceeds to read the stripe at the next page address of 3.

Figure 9E:
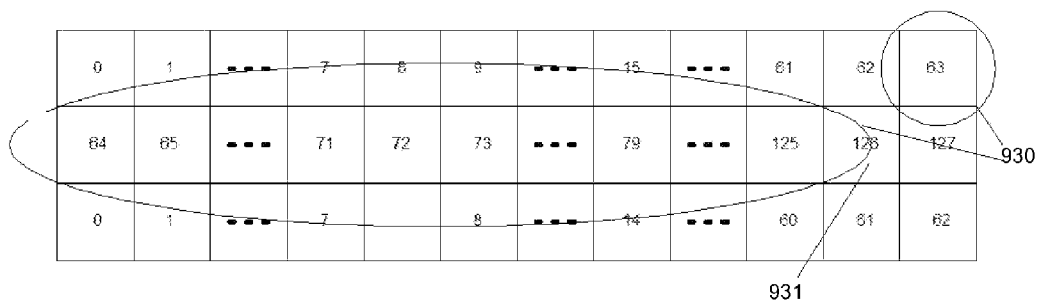

Referring to FIG. 9E, the stripe 930 at this page address is a re-write of Stripe 1, as indicated by the stripe number field, and this is the stripe number the described method is expecting. The data read from this stripe is copied into the target area just after the data from the re-write of Stripe 0 920. The data from page 126 (reference 931) of the target memory onwards may be overwritten with the correct data as read from the image saved on flash. The rest of the restore operation proceeds in a similar way until the end marker stripe is read from flash.

This described method has the advantage over known solutions to flash back-up in that it can adapt to blocks that were discovered to be bad during the actual back-up process. In addition, if an entire channel (i.e., flash device) were to fail, the back-up process could still continue. A complete channel failure would simply mean that all the pages belonging to that channel would be marked as bad in the grown bad pages map metadata fields of good pages in the back-up image. The described method would use the grown bad page maps to avoid reading from that channel in the same way that it avoided reading from a page in block n of a particular plane on a particular die on a particular channel.

After the restore is complete, the last page of each block in the back-up image could be read manually to determine where the grown bad planes in those blocks were. System firmware could then update its own bad block list so that these blocks can be avoided on future back-ups.

Figure 10:
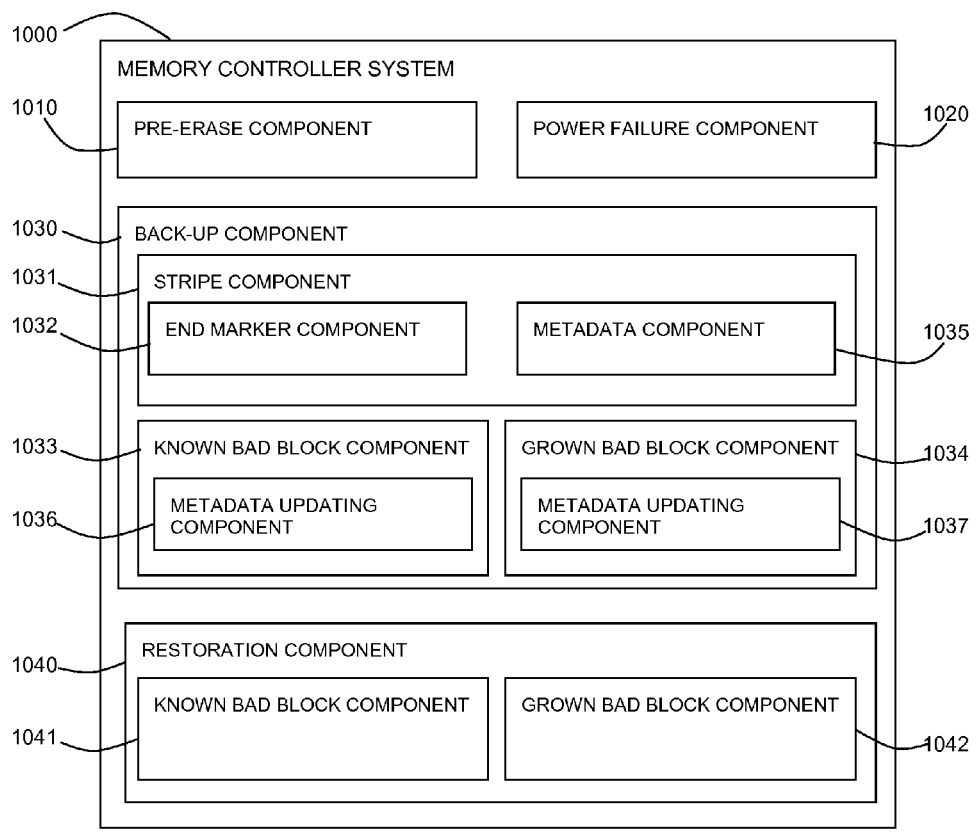
FIG. 10 is block diagram of an example embodiment of a flash memory controller system, in accordance with the present invention.

Referring to FIG. 10, a block diagram shows an example embodiment of a memory controller system 1000 for a flash memory system.

The memory controller system 1000 may include a pre-erase component 1010 for pre-erasing sufficient blocks from flash memory for the backed up data. The memory controller system 1000 may include a power failure component 1020 for determining if a power failure has occurred. A back-up component 1030 may be provided for backing-up the data during a temporary period of power provided by a temporary power source such as a charged capacitor.

The back-up component 1030 may include a stripe component 1031 for backing-up data in stripes, including an end marker component 1032 for inserting an end marker stripe to indicate the end of the backed up data. The stripe component 1031 may also include a metadata component 1035 for including metadata for a stripe in each page of a stripe.

The back-up component 1030 may include a known bad block component 1033 for accommodating known bad blocks in the back-up process. The back-up component 1030 may also include a grown bad block component 1034 for accommodating grown bad blocks in the back-up process. The known bad block component 1033 and the grown bad block component 1034 may each contain a metadata updating component 1036, 1037 for updating the metadata in each page of a stripe if known bad blocks or grown bad blocks are encountered.

A restoration component 1040 may be provided including a known bad block component 1041 for accommodating known bad blocks in the restoration process, and a grown bad block component 1042 for accommodating grown bad blocks in the restoration process.

Figure 11:
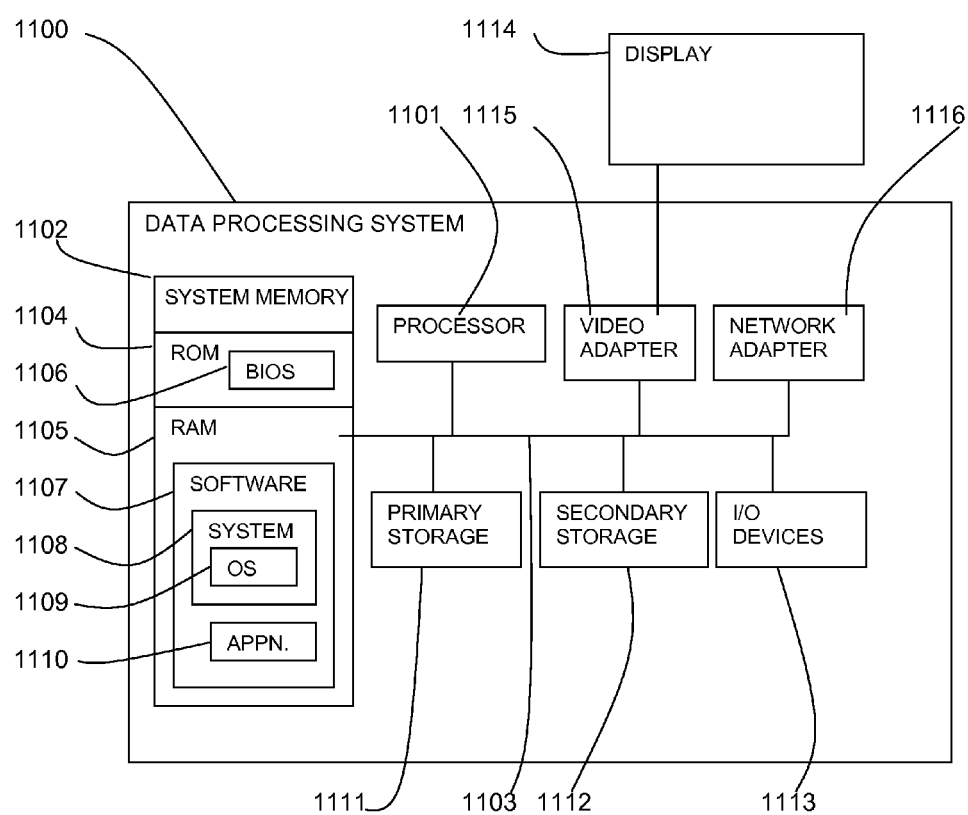
FIG. 11 is a block diagram of an embodiment of a computer system in which the present invention may be implemented.

Referring to FIG. 11, an exemplary system for implementing aspects of the invention includes a data processing system 1100 suitable for storing and/or executing program code including at least one processor 1101 coupled directly or indirectly to memory elements through a bus system 1103. The memory elements may include local memory employed during actual execution of the program code, bulk storage, and cache memories which provide temporary storage of at least some program code in order to reduce the number of times code must be retrieved from bulk storage during execution.

The memory elements may include system memory 1102 in the form of read only memory (ROM) 1104 and random access memory (RAM) 1105. A basic input/output system (BIOS) 1106 may be stored in ROM 1104. Software 1107 may be stored in RAM 1105, including system software 1108 and operating system software 1109. Software applications 1110 may also be stored in RAM 1105.

The system 1100 may also include a primary storage means 1111 such as a magnetic hard disk drive and secondary storage means 1112 such as a magnetic disc drive and an optical disc drive. The drives and their associated computer-readable media provide non-volatile storage of computer-executable instructions, data structures, program modules and other data for the system 1100. Software applications may be stored on the primary and secondary storage means 1111, 1112 as well as the system memory 1102.

The computing system 1100 may operate in a networked environment using logical connections to one or more remote computers via a network adapter 1116.

Input/output devices 1113 may be coupled to the system either directly or through intervening I/O controllers. A user may enter commands and information into the system 1100 through input devices such as a keyboard, pointing device, or other input devices (for example, microphone, joy stick, game pad, satellite dish, scanner, or the like). Output devices may include speakers, printers, etc. A display device 1114 is also connected to system bus 1103 via an interface, such as video adapter 1115.

Further advantages of the described back-up and restoration method are listed below:

The described method can be implemented purely in hardware whilst most solutions can only be implemented in software. This means that the described solution does not require a processor to function. A processor would require significant power. In a data back-up application, which is activated when main power fails and only has limited stand-by power available, a processor free solution is an advantage.

This described solution becomes more useful due to flash technology trends which indicate that as flash devices get smaller and more dense, the likelihood of encountering block errors increases. Thus a solution such as this, that handles bad blocks becomes more vital.

The described solution is device independent. Different vendors produce different configurations and versions of flash systems. The described method can be implemented to work with any of these devices.

It is known that, in particular, NAND flash memory degrades during the writing process, and this phenomenon is more prevalent as device geometries shrink. This invention provides a solution to overcoming the presence of bad memory blocks, without requiring firmware intervention during the write or read process. This design allows for very high performance when dumping and restoring data to/from flash devices, without firmware intervention.

The invention can take the form of an entirely hardware embodiment, an entirely software embodiment or an embodiment containing both hardware and software elements. In a preferred embodiment, the invention is implemented in software, which includes but is not limited to firmware, resident software, microcode, etc.

The invention can take the form of a computer program product accessible from a computer-usable or computer-readable medium providing program code for use by or in connection with a computer or any instruction execution system. For the purposes of this description, a computer usable or computer readable medium can be any apparatus that can contain, store, communicate, propagate, or transport the program for use by or in connection with the instruction execution system, apparatus or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read only memory (ROM), a rigid magnetic disk and an optical disk. Current examples of optical disks include compact disk read only memory (CD-ROM), compact disk read/write (CD-R/W), and DVD.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system". Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operations to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Improvements and modifications can be made to the foregoing without departing from the scope of the present invention.

What is claimed is:

1. A method for back-up of data to flash memory, comprising:
    organizing backed-up data into one or more stripes, wherein a stripe comprises a set of pages across all available flash memory devices which have a same block and page address; and
    responsive to encountering an error in a block of flash memory during back-up of a particular stripe of data, performing:
        re-writing the particular stripe of data starting at a next available page address and excluding a page of flash memory for the block having the error;
        writing subsequent stripes of data in the block having the error to pages excluding the page of flash memory for the block having the error; and
        embedding metadata for the particular stripe of data, the metadata including an indication of a location of the block having the error.

2. The method of claim 1, wherein embedding metadata for the particular stripe of data comprises embedding the metadata in each page of the particular stripe of data, and the metadata comprises:
    an identification number of the particular stripe of data;
    a stripe length field of an amount of data saved in the particular stripe of data; and
    an indication of known error blocks for the particular stripe of data.

3. The method of claim 1, wherein each of the available flash memory devices includes a channel, multiple dies, and multiple planes; and wherein a specific channel, die, and plane location of the block having the error is excluded from being written to.

4. The method of claim 1, further comprising:
    reading metadata from pages of a second stripe of data being backed-up;
    determining locations of known error blocks in the second stripe of data; and
    avoiding writing back-up data of the second stripe of data to the known error blocks in the second stripe of data by writing the back-up data of the second stripe of data to a next available page in the second stripe of data.

5. The method of claim 1, further comprising:
    updating the embedded metadata for the particular stripe of data and metadata for each subsequent stripe of data to include:
        an updated stripe size to indicate a capacity taking into account the block having the error; and
        the location of block having the error.

6. The method of claim 1, further comprising:
    writing an end marker stripe to indicate an end of backed up data, wherein the end marker stripe includes an indication of stripe length of zero.

7. The method of claim 1, further comprising:
    pre-erasing sufficient blocks of flash memory in the available flash memory devices for backing-up data.

8. The method of claim 1, further comprising:
    restoring backed-up data to target memory by reading all pages from a third stripe of backed-up data to target memory, reading metadata for the third stripe embedded in one or more pages of the third stripe, and using the embedded metadata of the third stripe to allow for bad blocks.

9. The method of claim 8, wherein using the embedded metadata to allow for bad blocks includes:
    determining which stripe is expected next from a stripe number in the embedded metadata for the third stripe; and
    responsive to determining that the stripe expected next is a stripe that has already been read:
        reading data and metadata of the third stripe including a position of a block in the third stripe having an error;
        re-reading data of the third stripe excluding a page for the block in the third stripe having the error;
        restoring the re-read data of the third stripe to a location in target memory that is associated with the stripe number; and
        adjusting a next expected stripe number.

10. The method of claim 8, wherein using the embedded metadata to allow for bad blocks comprises:
    determining any known error blocks in the third stripe from the metadata of the third stripe;
    re-reading data of the third stripe excluding a page for the the block in the third stripe having the error;
    reading subsequent stripes of data in the block in the third stripe excluding the page for the block in the third stripe having the error.

11. A system for back-up of data to flash memory, comprising:
    one or more computer processors;
    a stripe component for organizing backed-up data into one or more stripes, wherein a stripe comprises a set of pages across all available flash memory devices which have a same block and page address;
    a grown bad block component for performing, with the one or more computer processors, responsive to encountering an error in a block of flash memory during back-up of a particular stripe of data:
re-writing, with the one or more computer processors, the particular stripe of data starting at a next available page address and excluding a page of flash memory for the block having the error; and
writing, with the one or more computer processors, subsequent stripes of data in the block having the error to pages excluding the page of flash memory for the block having the error; and
a metadata component for embedding, with the one or more computer processors, metadata for the particular stripe of data, the metadata including an indication of a location of the block having the error.

12. The system of claim 11, wherein the metadata component for embedding metadata for the particular stripe of data embeds the metadata in each page of the particular stripe of data, the metadata including:
an identification number of the particular stripe of data;
a stripe length field of an amount of data saved in the particular stripe of data; and
an indication of known error blocks for the particular stripe of data.

13. The system of claim 12, wherein the grown bad block component further comprises:
a metadata updating component for updating the embedded metadata for the particular stripe of data and metadata for each subsequent stripe of data to include:
an updated stripe size to indicate a capacity taking into account the block having the error;
the location of the block having the error.

14. The system of claim 11, further comprising a known bad block component for:
reading metadata from pages of a second stripe of data being backed up;
determining locations of known error blocks in the second stripe of data; and
avoiding writing back-up data of the second stripe of data to the known error blocks in the second stripe of data by writing the back-up data of the second stripe of data to a next available page in the second stripe of data.

15. The system of claim 11, further comprising:
a restoration component for restoring backed up data to target memory by reading all pages from a third stripe of backed up data to target memory, reading metadata for the third stripe embedded in one or more pages of the third stripe, and using the embedded metadata of the third stripe to allow for bad blocks.

16. The system of claim 15, wherein the restoration component includes a grown bad block component for:
determining which stripe is expected next from a stripe number in the embedded metadata for the third stripe; and
responsive to determining that the stripe expected next is a stripe that has already been read:
reading data and metadata of the third stripe including a position of a block in the third stripe having an error;
re-reading data of the third stripe excluding a page for the block in the third stripe having the error;
restoring the re-read data of the third stripe to a location in target memory that is associated with the stripe number; and
adjusting a next expected stripe number.

17. A computer program product for back-up of data to flash memory, the computer program product comprising:
a non-transitory computer readable storage medium readable by a processing circuit and storing instructions for execution by the processing circuit for performing a method comprising:
organizing backed up data into one or more stripes, wherein a stripe comprises a set of pages across all available flash memory devices which have a same block and page address; and
responsive to encountering an error in a block of flash memory during back-up of a particular stripe of data, performing:
re-writing the particular stripe of data starting at a next available page address and excluding a page of flash memory for the block having the error;
writing subsequent stripes of data in the block having the error to pages excluding the page of flash memory for the block having the error; and
embedding metadata for the particular stripe of data, the metadata including an indication of a location of the block having the error.

18. The computer program product of claim 17, wherein embedding metadata for the particular stripe of data comprises:
embedding metadata in each page of the particular stripe of data, the metadata including:
an identification number of the particular stripe of data;
a stripe length field of an amount of data saved in the particular stripe of data; and
an indication of known error blocks for the particular stripe of data.

19. The computer program product of claim 17, wherein the method further comprises:
reading metadata from pages of a second stripe of data being backed up;
determining locations of known error blocks in the second stripe of data; and
avoiding writing back-up data of the second stripe of data to the known error blocks in the second stripe of data by writing the back-up data of the second stripe of data to a next available page in the second stripe of data.

* * * * *